United States Patent [19]

Hofmann et al.

[11] Patent Number: 4,847,469
[45] Date of Patent: Jul. 11, 1989

[54] CONTROLLED FLOW VAPORIZER

[75] Inventors: James J. Hofmann, Hacketts Town; Robert R. Hoffman, Lake Hopatcong, both of N.J.; John T. Felts, Alameda, Calif.

[73] Assignee: The BOC Group, Inc., Murray Hill, New Providence, N.J.

[21] Appl. No.: 73,676

[22] Filed: Jul. 15, 1987

[51] Int. Cl.⁴ .......................... H05B 3/58; F22B 1/28
[52] U.S. Cl. .................... 219/273; 219/305; 219/275
[58] Field of Search ............... 219/271, 273, 274, 275, 219/276, 301, 302, 303, 304, 305, 300

[56] References Cited

U.S. PATENT DOCUMENTS

| | | | |
|---|---|---|---|
| 3,458,948 | 8/1969 | Curtis | 219/305 |
| 3,718,805 | 2/1973 | Posey | 219/275 |
| 4,255,646 | 3/1981 | Dragoy | 219/275 |
| 4,447,374 | 5/1984 | Tanaka | 264/22 |
| 4,464,932 | 8/1984 | Ewing et al. | 73/204 |
| 4,645,684 | 2/1987 | Osada et al. | 427/38 |

OTHER PUBLICATIONS

Carballo et al., "Steam Generator", IBM Tech. Disc. Bull., vol. 15, No. 12, May 1973, p. 3887.
Wertheimer et al., Thin Solid Films, 115 (1984), pp. 109–124.
Mosakewski et al.; Synteria Tupda, vol. 5, No. 11, May, 1987.
"Hexamethyldisilazane (HMDS) HMDS Plus Delivery System," Product Data Sheet No. 17 Revision 2 of J. C. Schumacher Co., Oceanside, Calif.
Hasirci et al., J. of Biomed. Mater. Res., vol. 20 (1986), pp. 963–970.

Primary Examiner—Teresa J. Walberg

[57] ABSTRACT

A vaporizing apparatus delivers precisely controlled, substantially continuous and monitored vapor flows for uses such as in plasma enhanced vapor deposition. The vaporizing apparatus includes a fluid passageway along which are a pumping device, a vaporizing device, and a flowing device, all in fluid communication with the passageway. The vaporizing device vaporizes liquid pumped from the pumping device and includes a heat sink layer, a heated layer, and a portion of the passageway sandwiched therebetween. The vaporizing apparatus can sustain a flow of organosilicon vapor at a flow rate of about 1 to about 100 SCCM for as long as desired.

8 Claims, 2 Drawing Sheets

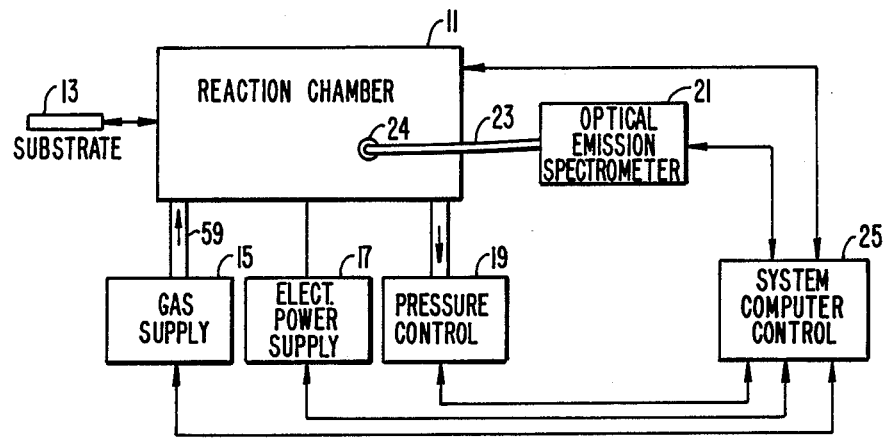
FIG._1.
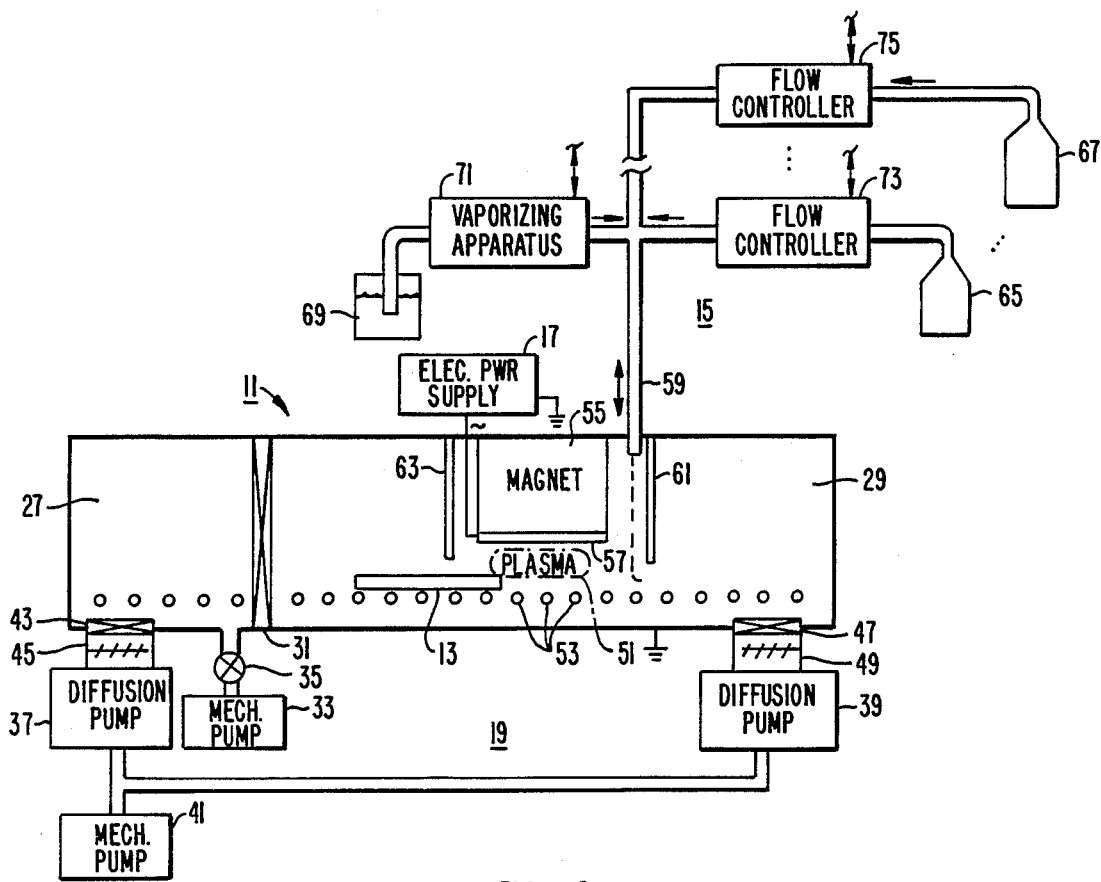
FIG._2.

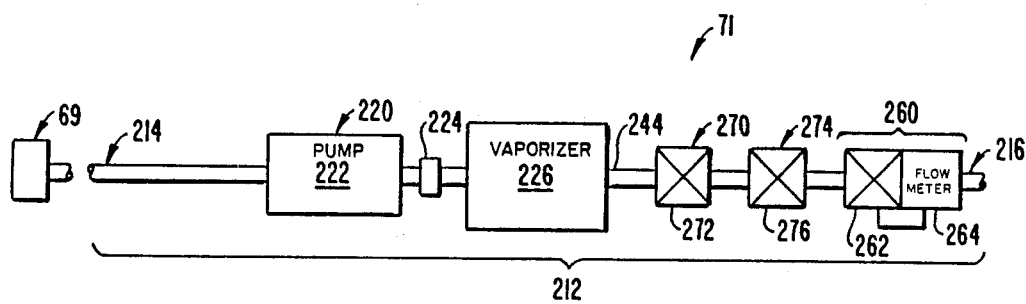
FIG._3.
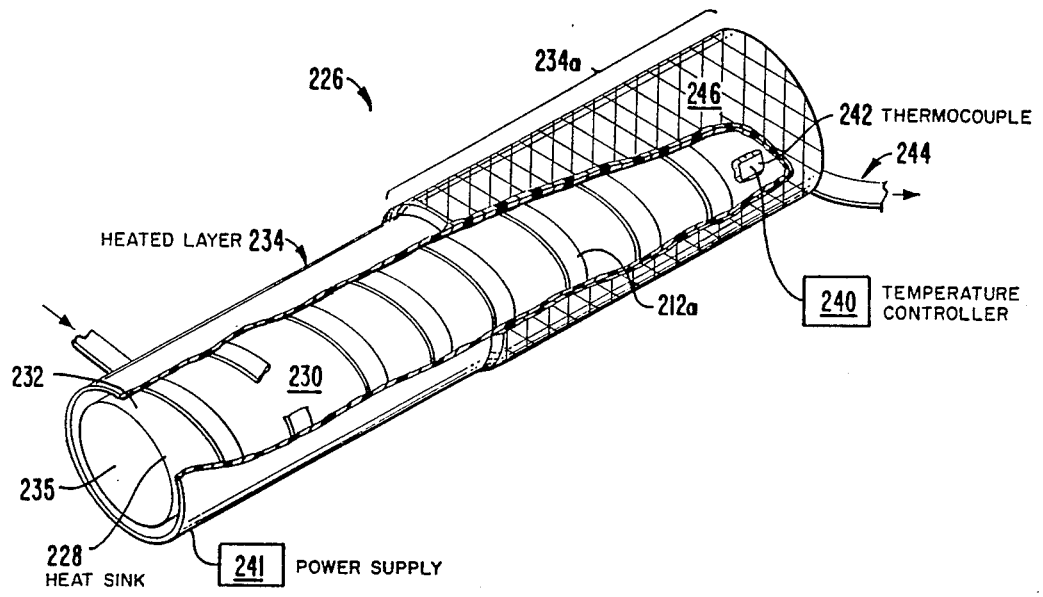
FIG._4.

CONTROLLED FLOW VAPORIZER

FIELD OF THE INVENTION

The present invention relates to vaporizers useful for vaporizing liquids having a boiling point above ambient temperature, and more particularly to a vaporizing apparatus useful with vacuum systems in which adjustably controlled amounts of a vaporized liquid may be flowed into the vacuum system.

BACKGROUND OF THE INVENTION

A variety of organic compounds are usefully introduced into a vacuum system to coat substrates. For example, styrene can be heated above its boiling point (145-146° C.), fed into a plasma glow discharge, and deposited as a replica film on a specimen for electron microscopy, as disclosed in U.S. Pat. No. 4,447,374, issued May 8, 1984, inventor Tanaka. A delivery system for delivering hexamethyldisilazane vapor by a carrier gas or vacuum suction in the range of one Torr has recently been described by a product data sheet of J. C. Schumacher Company, Oceanside, Calif. This delivery system is used in semiconductor photolithography processing as a priming agent to enhance photoresist adhesion during wafer patterning.

Sacher et al., U.S. Pat. No. 4,557,946, issued Dec. 10, 1985, describes use of plasma polymerized coatings from organosilicon compounds to form a moisture barrier on the substrate by heating the substrate and controlling the plasma power level. Wertheimer et al., U.S. Pat. No. 4,599,678, issued July 8, 1986, discloses use of an organosilicon in a glow discharge to coat thin film capacitors when these substrates are heated to a temperature in excess of 50° C.

Vaporizing systems for such glow discharge uses have sometimes introduced the vapor through a needle valve, and the liquid has typically been vaporized either by simply heating a liquid reservoir or in response to the pressure difference when coupled to a vacuum system. These prior known devices do not provide for a precisely controlled, substantially continuous and monitored delivery of vapor flow into an associated vacuum system.

SUMMARY OF THE INVENTION

It is an object of the present invention that a vaporizing apparatus provide precisely controlled flows of a gas by vaporizing a volatile liquid with the flowing gas being substantially continuous at a predetermined, monitored flow rate.

In one aspect of the present invention, a vaporizing apparatus comprises a fluid passageway along which are a pumping means, a vaporizing means, and a flowing means, all in fluid communication with the passageway. The pumping means pumps metered quantities of a compound being liquid at ambient temperature from a liquid reservoir towards the vaporizing means. The vaporizing means vaporizes the liquid when pumped from the pumping means and preferably includes a heat sink layer, a heated layer and a portion of the passageway sandwiched therebetween. The flowing means flows the vaporized liquid at a predetermined flow rate from the vaporizing means towards the outlet.

The vaporizing apparatus can sustain a flow of organosilicon vapor to within about +0.1% for flow rates up to about of 100 SCCM for as long as desired and may be scaled up in size for larger flow rates. While the vaporizing apparatus is exemplified in association with a vacuum system for plasma enhanced vapor deposition, it may be readily modified for other vacuum or atmospheric applications.

BRIEF DESCRIPTION OF THE DRAWINGS

In the drawings:

FIG. 1 is a general schematic diagram illustrating a plasma system with which the present invention in useful;

FIG. 2 schematically illustrates a side sectional view of a plasma deposition chamber and its associated equipment, including an embodiment of the invention;

FIG. 3 schematically illustrates a side view of an inventive embodiment; and

FIG. 4 is a perspective view, partially broken away, of an element of a preferred embodiment.

DETAILED DESCRIPTION OF THE PREFERRED EMBODIMENT

Referring to FIG. 2, a vaporizing apparatus 71 may be assembled with a vacuum system, as schematically illustrated and more fully described by U.S. Pat. Application Serial No. 07/073,928, filed concurrently, "PLASMA THIN FILM DEPOSITION PROCESS CONTROL," now abandoned, inventors John T. Felts and Eugene S. Lopata, of common assignment herewith and incorporated by reference. However, it should be understood that the vaporizing apparatus 71 may be used with a wide variety of liquids at ambient temperature (that is, having a boiling point above ambient temperature) whenever controlled flow rates of the vaporized liquid are desired, and may be utilized with systems other than the illustrated vacuum system. The vacuum system with which vaporizing apparatus 71 is usefully associated will now be briefly described.

Referring initially to FIG. 1, a system is schematically illustrated that includes an enclosed reaction chamber 11 in which a plasma is formed and in which a substrate, such as substrate 13, is placed for depositing a thin film of material on it. The substrate 13 can be any vacuum compatible material, such as metal, glass, some plastics and other coated substrates. One or more gases are supplied to the reaction chamber by a gas supply system 15. An electric field is created by a power supply 17, and a low pressure is maintained by a pressure control system 19. An optical emission spectrometer 21 is connected through an optical fiber light transmission media 23 to the reaction chamber in some appropriate manner to couple the visible and near visible emission of the plasma to the spectrometer. A quartz window 24 in a side wall of the reaction chamber can be used to optically couple the plasma emission with the external fiber medium 23. A general system control 25, including a computer control portion, is connected to each of the other components of the system in a manner to receive status information from them and send controlling commands to them.

The reaction chamber 11 can, in the system of FIG. 1, be of an appropriate type to perform any of the sputtering, plasma-enhanced chemical vapor deposition (PECVD), plasma polymerization processes or other vacuum thin film deposition processes. A more detailed explanation of certain components of the system of FIG. 1 will now be given with respect to a PECVD or plasma polymerization process.

Turning to FIG. 2, the reaction chamber 11 is divided into a load lock compartment 27 and a process compartment 29 by an isolation slit valve 31. The pressure control system 19 includes a mechanical pump 33 connected to the load lock chamber 27 by a valve 35. The pressure control system also includes diffusion pumps 37 and 39, and an associated mechanical pump 41. The diffusion pump 37 is connected to the load lock chamber 27 through an isolation gate valve 43 and an adjustable baffle 45. Similarly, the diffusion pump 39 is connected to the process chamber 29 through an isolation gate valve 47 and an adjustable baffle 49. The baffle 49 is controlled by the system control 25, while a coating process is being carried out, in order to maintain the internal pressure at a desired value.

A substrate to be coated is first loaded into the load lock compartment 27 with the valve 31 closed. The mechanical pump 33 then reduces the pressure most of the way to an operating pressure. The diffusion pump 37 is then operated to reduce the pressure further, to its final operating pressure. That operating pressure is typically in the neighborhood of 46 microns for a PECVD or plasma polymerization process. During loading and unloading operations, the diffusion pump 39 maintains the deposition chamber 29 at the operating pressure. Once the load lock chamber 27 is reduced to that operating pressure, the valve 31 is opened and the substrate 13 moved into the deposition chamber 29.

Provision is made for moving the substrate 13 back and forth through a region 51 where a plasma is formed. In the example system being described, this is accomplished by a plurality of rollers 53, preferably made of aluminum having Viton O-ring spacers or similar material, that are driven by a motor source (not shown) to rotate about their axes and thus move the substrate 13. A typical deposition process involves passing the substrate 13 back and forth through the plasma 51 a number of times in order that the thin film deposited on the top of the substrate 12 has a uniform thickness.

A magnetron is positioned within the chamber 29, formed of a magnetic structure 55 and a cathode 57. The power supply 17 has its output connected between the cathode 57 and a metallic body of the reaction chamber 29. The magnetron creates an appropriate combination of magnetic and electrical fields in the region 51 in order to create a plasma there when the proper gases are introduced into the reaction chamber 29. The substrate 13 is maintained electrically isolated and is passed directly through the plasma region 51.

The gaseous components necessary for the plasma to form in the region 51 are introduced into the deposition chamber 29 by a conduit 59. A tube (not shown) having a plurality of gas supply nozzles along its length is positioned across the width of the chamber 29 (in a direction into the paper of FIG. 2) at the position where the conduit 59 enters the chamber. That gas flows within the deposition chamber 29 from the supply tube to the diffusion pump 39, as shown in dotted outline in FIG. 2. It has been found preferable to introduce the gas on the side of the plasma region 51 that is closest to the pump 39. A pair of baffles 61 and 63 on either side of the magnetron also helps to confine the gas flow to the plasma region 51.

A particular gas supply system 15 that is connected to the conduit 59 depends, of course, on how many gases are being combined and their nature. In the example of FIG. 2, two separate sources 65 and 67 of gases under high pressure are utilized, fewer or additional such gas sources being necessary for other processes. Also, in this particular example, a source 69 of a liquid material to be vaporized is provided. The inventive vaporizing apparatus 71 provides the desired flow of vapor into the input conduit 59, such as in accordance with a control signal from the system control 25. Similarly, the high pressure gases 65 and 67 may be delivered through individually controlled flow meters 73 and 75, respectively.

Turning to FIG. 3, the vaporizing apparatus 71 comprises a fluid passageway 212 defining an inlet 214 and an outlet 216. Inlet 214 is where the liquid is introduced into vaporizing apparatus 71 from a liquid source 69, or reservoir, and outlet 216 is where controlled flow of the vaporized liquid may be delivered to an associated vacuum system or other desired system.

Means 220 for pumping metered quantities of the liquid is in fluid communication with the passageway 212 and is adjacent to inlet 214. Pumping means 220 may be a metering pump 222 disposed downstream of inlet 214. For example, when vaporizing apparatus 71 is intended to deliver flow rates between about 1 and 100 SCCM (standard cubic centimeters per minute), then metering pump 222 should pump about 1 to 100 $\mu$l per cycle. Where a vapor pressure of about 160 Torr is desired downstream, then the metering pump 222 will typically pump about once or twice per minute. The pumping rate is preferably controlled by a pressure sensor 224 downstream of pumping means 220 and in fluid communication with passageway 212.

As may be seen in FIG. 3, means 226 for vaporizing the liquid is in fluid communication with passageway 212 downstream of pumping means 220.

Turning to FIG. 4, vaporizing means 226 preferably includes a heat sink layer 228, a heated layer 234, and a portion 212a of passageway 212 is sandwiched therebetween so as to thermally transfer excess heat from heated layer 234 to heat sink layer 228.

Passageway portion 212a must be of a length sufficient for vapor buildup in order to deliver substantially continuous vapor flow downstream of vaporizing means 226. For example, when delivering vapor flows of between about 1 to 100 SCCM, a length of at least about 7 inches when portion 212a is 0.25 inch in diameter is sufficient, and more preferably the portion 212a is about two to three feet.

Heat sink layer 228 is formed of a highly heat conductive material, such as for example, copper configured as tubing 230. When heat sink layer 228 is tubing 230, then passageway portion 212a is preferably wound in a spiral along the outer surface 232 of tubing 230.

Passageway portion 212a must be in good thermal contact with heat sink layer 228, such as by silver soldering to tubing 230. An inside 235 of tubing 230 may be left open to ambient air in order to permit the excess absorbed heat from passageway portion 212a to be dissipated.

Heat sink layer 228 is preferably tubing 230 due to availability for fabrication, but could be planar or differently configured. Vapor exits vaporizing means 226 in passageway 212 when associated with a vacuum system for vapor deposition typically at a vapor pressure of about 160 Torr.

Heated layer 234 may be composed of a flexible, resistant wire wrapped in a high heat resistant covering, sometimes hereinafter referred to as "heating tape". Heated layer 234 is operatively associated with a temperature controller 240 adapted to maintain heated layer 234 at a temperature above the boiling point of the liquid, and where heating tape is used, is heated by power supply 241. For example, useful liquids for plasma enhancement deposition include vinyltrimethylsilane, with a boiling point of 55.5° C., and hexamethyldisilizane, with a boiling point of 127° C. Temperature controller 240 preferably includes a thermocouple 242 that is attached, as by soldering, to heat sink layer 228, and is preferably located near an output 244 of vaporizing means 226.

Vaporizing means 226 preferably further includes a thermal barrier layer 246 enveloping a portion 234a of heated layer 234 adjacent output 244 and may be formed, for example, of a glass fiber blanket covered by aluminum foil. Where, for example, heat sink layer 228 is configured as tubing 230, then portion 234a may be about half of the length of tubing 230. Thermal barrier layer 246 functions to ensure that vaporized liquid exiting passageway portion 212a does not condense.

Returning to FIG. 3, upstream of outlet 216 is means 260 for flowing the vaporized liquid at a predetermined flow rate towards outlet 216. Flowing means 260 preferably includes a control valve 262 and a flow meter 264. Control valve 262 may be a solenoid valve or a piezoelectric valve. Flow meter 264 is adapted to compare a preselected flow rate with an actual output and to make appropriate corrections until the flow output equals the preselected input. A preferred flow meter 264 operates as described by U.S. Pat. No. 4,464,932, issued Aug. 14, 1984, inventors Ewing et al., incorporated herein by reference.

Flow meter 264 is in an electronic feedback loop with control valve 262, so as to electronically signal the opening and closing control valve 262 to prevent condensation of the vapor within flow meter 264. It is important that control valve 262 be upstream of flow meter 264 because if control valve 262 were downstream of flow meter 264, then vapor could condense in flow meter 264 due to insufficient pressure drop. Control valve 262 functions to physically impede the vapor flow by increasing or decreasing a restriction in the passageway. Although control valve 262 is preferably electronically actuated, it could be a manually operated needle valve or the like.

In addition to the necessary pumping means 220, vaporizing means 226 and flowing means 260, vaporizing apparatus 71 preferably includes means 270 for isolating the vaporized liquid from outlet 216 upstream of the flowing means 260. Isolating means 270 may be a bellows valve 272 in fluid communication with passageway 212. In addition, means 274 for controlling a pressure drop in passageway 212, such as a needle valve 276, preferably is in fluid communication with passageway 212, preferably upstream of the flowing means 260 and downstream of the isolating means 270. Controlling means 274 may be a fixed constriction in passageway 212, because a constriction could cause enough pressure drop so that even at room temperature the vapor would not condense. With a flow rate of about 10 to about 100 SCCM, for example, a pressure drop of from about 160 Torr to about 0.01 Torr is sufficient. However, use of needle valve 276 as the controlling means 274 permits adjustable control of the pressure drop, since the associated micrometer permits very fine adjustments for the flow conductance. Thus, the vaporizing apparatus can be used for a variety of volatile liquids.

If the vaporizing apparatus 71 is not associated with a vacuum system, for example where outlet 216 delivers vapor into a system at atmospheric pressure, then instead of the exemplified 160 Torr, the pressure should be at about 1,000 Torr, and the controlling means 274 would be set for a pressure drop to about 900 Torr.

The exemplified deposition chamber 29 had a size of 12 inches by 12 inches by 24 inches, and the vaporizing apparatus 71 is believed to have a maximum flow rate of about 700 SCCM for this dimensional scale which should be adequate for most applications. However, the vaporizing apparatus 71 is not limited to the exemplified dimensions since it can be readily scaled up.

A preferred embodiment will now be exemplified, but it should be understood that the invention is entitled to protection within the full scope of the appended claims.

EXPERIMENTAL

The vaporizing apparatus was in the configuration schematically illustrated by FIG. 3. The metering pump was set to pump 10 microliters of organosilicon fluid at a pumping rate of about 1-2 times per minute for a vapor pressure (before the pressure drop) of about 160 Torr, as determined and controlled by a pressure sensor. The passageway had an I.D. of 0.25 inches, except where constricted by the valves or divided for flow rate metering. The passageway portion of the vaporizing means was about 2 to 3 feet, spiraled along a one-inch I.D. copper pipe. A one-inch glass fiber blanket, further wrapped with aluminum foil, was wrapped around the downstream half of the vaporizing means. The heating tape, controlled by a Variac variable power supply, was maintained at 100° C. The needle valve was set to permit a flow conductance of 0.003 inches.

The flow meter and control valve were purchased as Model 1258B from MKS Instruments, Inc., Burlington, Mass., but the control valve was installed upstream of the flow meter.

The chamber was evacuated to a base pressure of not greater than about $3 \times 10^{-6}$ Torr. The load lock was vented to atmosphere while the chamber was maintained under high vacuum. Then the load lock was evacuated with the substrate loaded therein. Meanwhile, the vaporizing means had been heated to a constant temperature of 100° C., had vaporized organosilicon therein, but was isolated by isolating means from the chamber until the gas inlet was opened. The flowing means was set for the desired flow reading of organosilicon. The desired gas flows of the additional components were set on each component's flow controller, and the pressure in the chamber was adjusted to the desired value by adjusting a baffle over the diffusion pump. The load lock diffusion pump was closed and the valve isolating the load lock and the chamber was opened. After the pressure in the chamber stabilized, the power supply was turned on and adjusted to the desired value. Thus, the glow discharge plasma is established in the chamber. The pressure was again stabilized and adjusted if necessary. The desired process conditions were selected (power, current and voltage of the power supply, the pressure of the chamber, the organosilicon flow, and the pressure in the vaporizing apparatus). An emission spectrum from a control program was used to find the appropriate hydrogen (alpha) to inert gas ratio. The organosilicon flow into the chamber adjusted until the desired hydrogen (alpha) to inert gas ratio was obtained. The substrate was then conveyed back and forth through the plasma region until the desired coating thickness was achieved while continuing to monitor the process conditions and making appropriate adjustments according to the diagnostic method. Once the desired film thickness was obtained, the system was shut down and the coating substrate removed. This control program and the process are more fully described in U.S. Application Ser. No. 07/073,792 Eugene S. Lopata and John T. Felts, filed concurrently, "METHOD OF PLASMA ENHANCED SILICON OXIDE DEPOSITION," of common assignment herewith.

EXAMPLE I

The gas stream composition shown below was flowed into the plasma within the chamber and deposited as a substantially inorganic, hard silicon oxide based film onto a clear glass substrate. A conveyor speed was 10 inches per minute, and the power was 1,000 watts, 40 KHz. The chamber pressure during the depositing was 46 microns, and the film was formed by 37 passes of the substrate through the plasma over a period of 19 minutes.

TABLE I

| Gas Stream Composition (SCCM) | Hardness | Deposition Rate (A/minute) |
|---|---|---|
| HMDSO | 9+ | 226 |
| 35 $O_2$ | | |
| 46 He | | |
| 2.1 $C_3H_6$ | | |
| 6.0 $N_2$ | | |

The HMDSO (hexamethyldisiloxane) was flowed into the chamber during the entire depositing at the carefully controlled and monitored 35 SCCM flow rate by means of the inventive vaporizing apparatus. The hardness value was tested in accordance with ASTM D3363-74, with the numbers reported being based on a scale of 0 to 10 where 0 means the least scratch resistance and 10 means there was no damage to the coating when scratched.

While the invention has been described in connection with specific embodiments thereof, it will be understood that it is capable of further modifications, and this application is intended to cover any variations, uses or adaptations of the invention following, in general, the principles of the invention and including such departures from the disclosure as come within the known or customary practice in the art to which the invention pertains and as may be applied to the essential features hereinbefore set forth, and as fall within the scope of the invention and the limits of the appended claims.

I claim:

1. A vaporizing apparatus useful for delivering a controlled flow of vapor comprising:
   a fluid passageway defining an inlet and an outlet;
   means for pumping metered quantities of a liquid having a boiling point above ambient temperature from the inlet towards the outlet;
   means for vaporizing the liquid within the passageway, the vaporizing means being in fluid communication with the passageway downstream of the pumping means, the vaporizing means including a heat sink layer, a heated layer, and a portion of the passageway sandwiched therebetween;
   means for flowing the vaporized liquid towards the outlet while maintaining the flow at a predetermined flow rate; and
   means for controlling a pressure drop in the passageway of vaporized liquid upstream of the flowing means.

2. The vaporizing apparatus as in claim 1 further comprising:
   means for isolating the vaporized liquid from the outlet upstream of the flowing means and in fluid communication with the passageway.

3. The vaporizing apparatus as in claim 1 or 2 wherein the passageway portion of the vaporizing means is in heat conductive communication with the heated layer and with the heat sink.

4. The vaporizing apparatus as in claim 3 wherein the heated layer of the vaporizing means includes at least one temperature controller adapted to maintain the heated layer at a temperature above the boiling point of the liquid.

5. The vaporizing apparatus as in claim 4 wherein the vaporizing means include a thermal barrier adjacent to the heated layer and outward with respect the passageway portion.

6. The vaporizing apparatus as in claim 5 wherein the heat sink layer is tubular, defines an outer surface, and the passageway portion is carried upon the outer surface.

7. The vaporizing apparatus as in claim 1 wherein the flowing means includes a flow meter and a control valve, the flow meter and control valve being in fluid communication with the passageway, the control valve being upstream of the flow meter.

8. The vaporizing apparatus as in claim 7 wherein the flow meter is adapted to open and close the control valve to prevent condensation of flowing vapor within the flow meter.

* * * * *